(12) United States Patent
Hutzler et al.

(10) Patent No.: US 9,614,044 B2
(45) Date of Patent: Apr. 4, 2017

(54) SEMICONDUCTOR DEVICE WITH CURRENT SENSOR

(71) Applicant: Infineon Technologies Austria AG, Villach (AT)

(72) Inventors: Michael Hutzler, Villach (AT); Maximilian Roesch, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/853,164

(22) Filed: Sep. 14, 2015

(65) Prior Publication Data
US 2016/0079377 A1 Mar. 17, 2016

(30) Foreign Application Priority Data
Sep. 15, 2014 (DE) .......... 10 2014 113 254

(51) Int. Cl.
*H01L 29/772* (2006.01)
*H01L 29/739* (2006.01)
*H01L 29/66* (2006.01)
*H01L 29/40* (2006.01)
*H01L 29/78* (2006.01)
*H01L 29/06* (2006.01)
*H01L 27/088* (2006.01)

(52) U.S. Cl.
CPC ........ *H01L 29/407* (2013.01); *H01L 29/0696* (2013.01); *H01L 29/404* (2013.01); *H01L 29/7397* (2013.01); *H01L 29/7813* (2013.01); *H01L 29/7815* (2013.01); *H01L 27/088* (2013.01)

(58) Field of Classification Search
CPC ................................................. H01L 29/66712
USPC ......................................................... 257/334
See application file for complete search history.

(56) References Cited

U.S. PATENT DOCUMENTS

2003/0047777 A1* 3/2003 In't Zandt ............. H01L 29/404
257/329
2006/0214221 A1* 9/2006 Challa ................. H01L 21/3065
257/328

(Continued)

FOREIGN PATENT DOCUMENTS

DE 102004024887 A1 12/2005
DE 102006048625 A1 4/2008

(Continued)

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

A semiconductor device includes a semiconductor body. The semiconductor body includes a load transistor part and a sensor transistor part. A first source region of the load transistor part and a second source region of the sensor transistor part are electrically separated from each other. A common gate electrode in a common gate trench extends into the semiconductor body from a first surface. A first part of the common gate trench is in the load transistor part, and a second part of the common gate trench is in the sensor transistor part. A field electrode in a field electrode trench extends into the semiconductor body from the first surface. A maximum dimension of the field electrode trench parallel to the first surface is smaller than a depth of the field electrode trench.

20 Claims, 8 Drawing Sheets

(56) References Cited

U.S. PATENT DOCUMENTS

| | | | |
|---|---|---|---|
| 2007/0108511 A1* | 5/2007 | Hirler | H01L 29/407 257/328 |
| 2009/0283797 A1* | 11/2009 | Takahashi | H01L 29/7397 257/139 |
| 2010/0291767 A1* | 11/2010 | Miura | C23C 14/165 438/653 |
| 2014/0209905 A1 | 7/2014 | Meiser et al. | |
| 2015/0014687 A1* | 1/2015 | Nakajima | G01R 19/0084 257/48 |

FOREIGN PATENT DOCUMENTS

| | | |
|---|---|---|
| DE | 102007020248 A1 | 11/2008 |
| DE | 102014100877 A1 | 7/2014 |

* cited by examiner

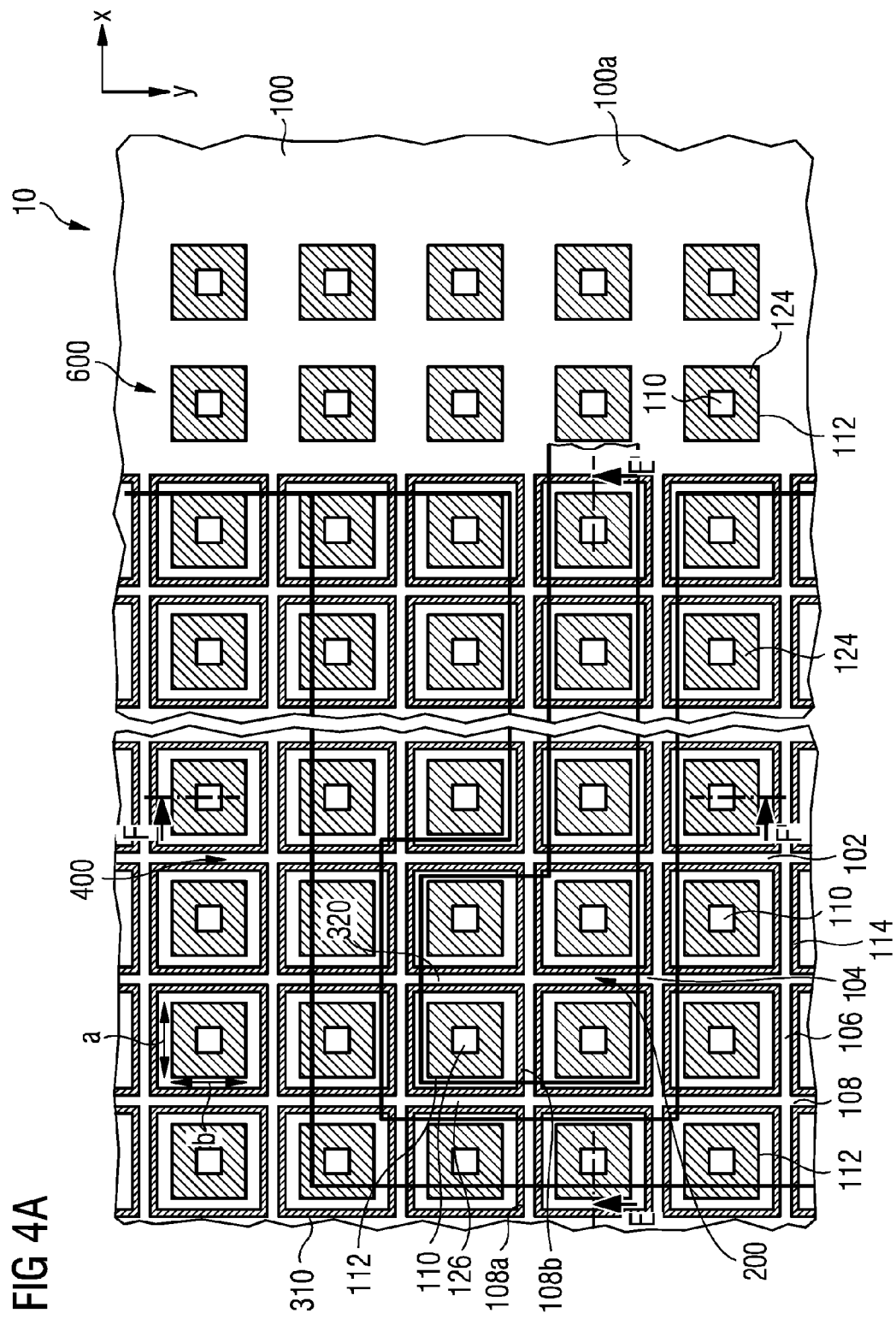

SEMICONDUCTOR DEVICE WITH CURRENT SENSOR

PRIORITY CLAIM

This application claims priority to German Patent Application No. 10 2014 113 254.8 filed on 15 Sep. 2014, the content of said application incorporated herein by reference in its entirety.

BACKGROUND

A key component in semiconductor application is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In order to realize self-protecting power switches, it is customary inter alia to integrate a current sensor. The current sensor may be realized as a small sensor transistor, which supplies a current proportional to the load current flowing through the load transistor. The sensor transistor is substantially smaller, e.g. a factor of 1000-50000 smaller than the load transistor, and a sensor current flowing through the sensor transistor is smaller than the load current through load transistor ideally by the geometrical ratio of the active areas of the two transistors, namely the load transistor and the sensor transistor.

The actual ratio of the current flowing through the load transistor and the current flowing through the sensor transistor may depend on process variations and on operating conditions like the operating temperature. This is because of partially commonly used conduction paths between sense and load transistor and partially separate conduction paths. It is thus desirable to provide a semiconductor device, in which the dependence of the actual ratio of the load transistor and sensor transistor currents on process variations and operating conditions is reduced.

SUMMARY

According to an embodiment of a semiconductor device, the semiconductor device comprises a semiconductor body. The semiconductor body comprises a load transistor part and a sensor transistor part. A first source region of the load transistor part and a second source region of the sensor transistor part are electrically separated from each other. A common gate electrode in a common gate trench extends into the semiconductor body from a first surface, wherein a first part of the common gate trench is in the load transistor part and a second part of the common gate trench is in the sensor transistor part. A field electrode in a field electrode trench extends into the semiconductor body from the first surface. A maximum dimension of the field electrode trench parallel to the first surface is smaller than a depth of the field electrode trench.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 4A is a schematic plan view of a portion of a semiconductor device according to another embodiment.

DETAILED DESCRIPTION

Figure 1A:
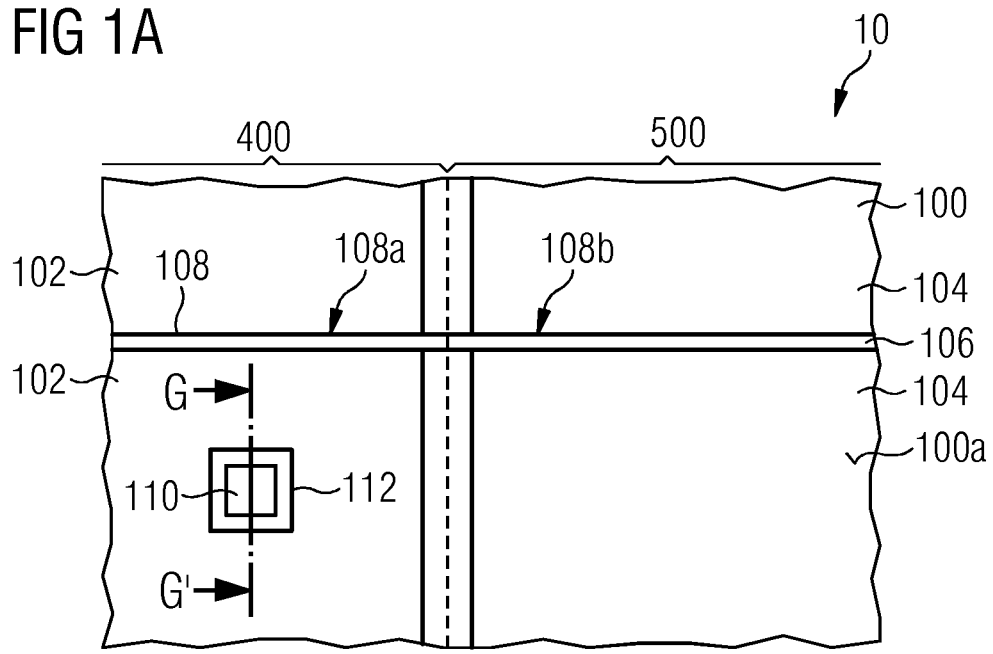
FIG. 1A is a schematic plan view of a portion of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "–" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor body" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

It is to be understood that the features of the various embodiments described herein may be combined with each other, unless specifically noted otherwise.

Figure 1B:
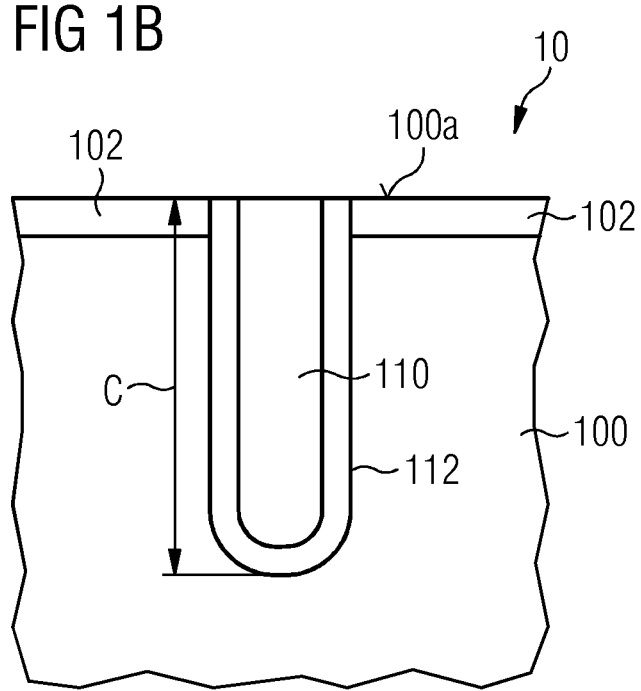
FIG. 1B is a schematic cross-sectional view of a portion of a semiconductor device taken along the section plane G-G' of FIG. 1A.

FIG. 1A is schematic plan view of a portion of a semiconductor device 10 according to an embodiment. The semiconductor device 10 comprises a semiconductor body 100. The semiconductor body 100 comprises a load transistor part 400 and a sensor transistor part 500. A first source region 102 of the load transistor part 400 and a second source region 104 of the sensor transistor part 500 are electrically separated from each other. A common gate electrode 106 in a common gate trench 108 extends into the semiconductor body 100 from a first surface 100a, wherein a first part 108a of the common gate trench 108 is in the load transistor part 400 and a second part 108b of the common gate trench 108 is in the sensor transistor part 500. The semiconductor body 100 further comprises a field electrode 110 in a field electrode trench 112 extending into the semiconductor body 100 from the first surface 100a, as can be seen from FIG. 1B. According to an embodiment, a maximum dimension of the field electrode trench 112 parallel to the first surface 100a is smaller than a depth c of the field electrode trench 112.

Figure 2A:
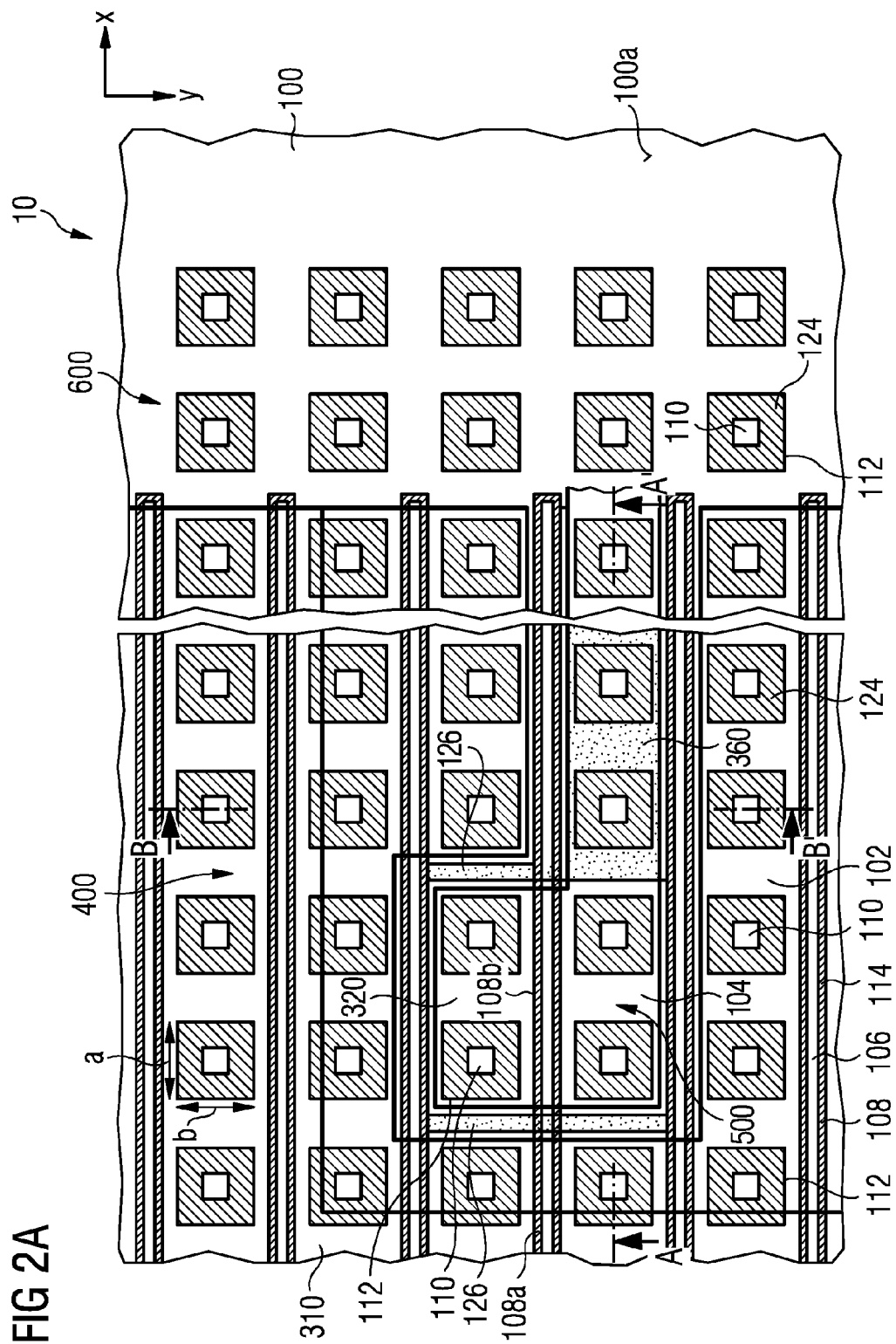
FIG. 2A is a schematic plan view of a portion of a semiconductor device according to another embodiment.
Figure 2B:
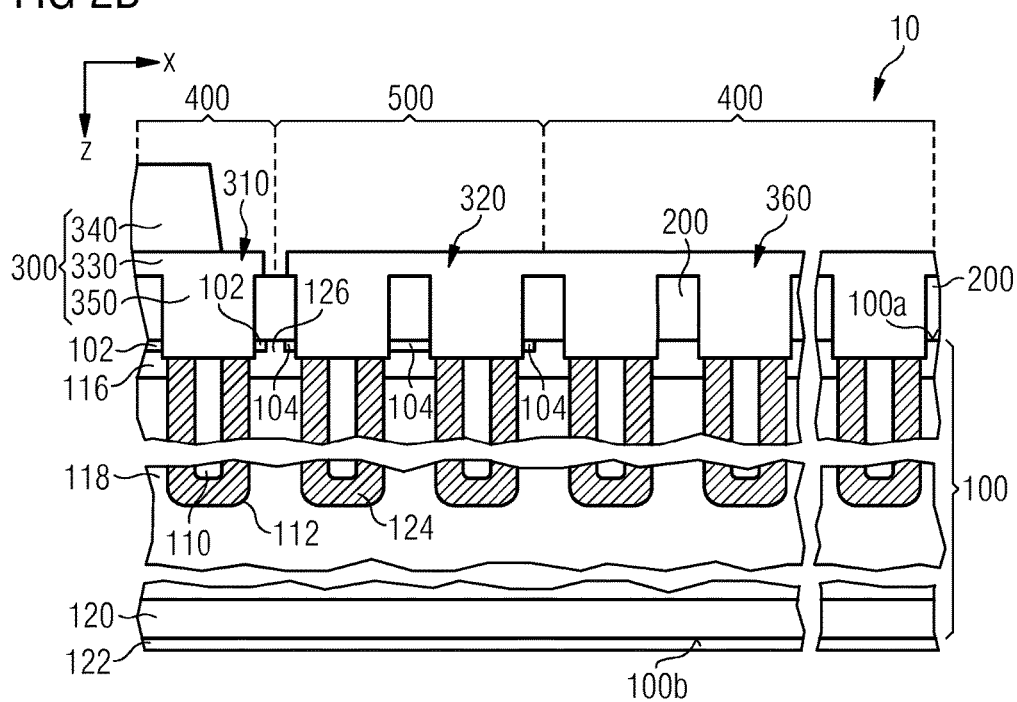
FIG. 2B is a schematic cross-sectional view of a portion of a semiconductor device taken along the section plane A-A' of FIG. 2A.
Figure 2C:
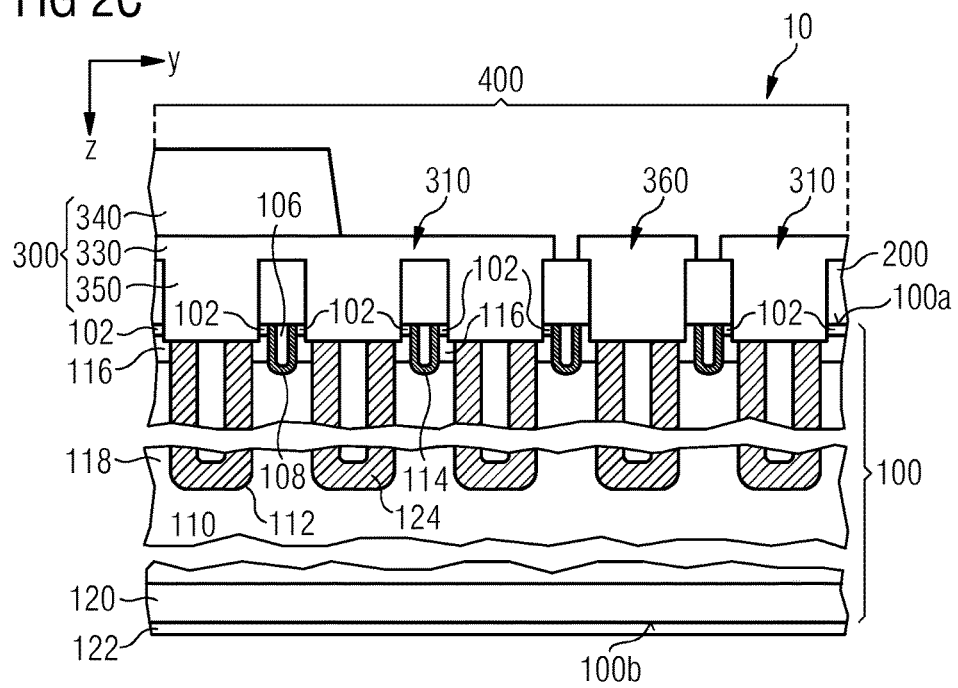
FIG. 2C is a schematic cross-sectional view of a portion of a semiconductor device taken along the section plane B-B' of FIG. 2A.

FIG. 2A is a schematic plan view of a portion of the semiconductor device 10 according to another embodiment. FIGS. 2B and 2C are schematic cross-sectional views of a portion of the semiconductor device 10 taken along the section plane A-A' and the section plane B-B' of FIG. 2A, respectively.

As can be seen from FIG. 2A to 2C, the semiconductor device 10 may be a vertical semiconductor device comprising transistor elements, e.g. transistor cells such as IGBT (insulated gate bipolar transistor) cells, e.g. RC-IGBT (reverse-conducting IGBT) cells, RB-IGBT (reverse-blocking IGBT) cells and IGFET (insulated gate field effect transistor) cells including MOSFET (metal oxide semiconductor field effect transistor) cells.

The semiconductor device 10 includes the semiconductor body 100. The semiconductor body 100 includes a semiconductor material, for example silicon Si, silicon carbide SiC, germanium Ge, silicon germanium SiGe, gallium nitride GaN or gallium arsenide GaAs. The semiconductor body 100 may include a semiconductor layer structure having one or more semiconductor layer(s), e.g. epitaxial layer(s) on a semiconductor substrate. Outside the illustrated portion, the semiconductor body 100 may include, inter alia, further doped and undoped sections, semiconductor layers, insulating and conducting structures, edge termination areas including junction termination extension (JTE) structures, variation of lateral doping (VLD) structures, ring structures, field plates, for example.

The semiconductor body 100 has the first surface 100a and a second surface 100b which is opposite to the first surface 100a. A distance between the first and second surfaces 100a, 100b is selected to achieve a specified voltage blocking capability and may be at least 30 µm, for example at least 100 µm. Herein, only the upper part of this distance is used for voltage blocking, the rest is for mechanical stability reasons. Other embodiments may provide semiconductor bodies 100 with a thickness of several 100 µm. The semiconductor body 100 may have a rectangular shape with an edge length in the range of several millimeters, for example. The normal to the first and second surfaces 100a, 100b defines a vertical direction and directions orthogonal to the normal direction are lateral directions.

As can be further seen from FIGS. 2A and 2C, a plurality of gate trenches 108 are arranged in the semiconductor body 100, which extend in a first direction x parallel to the first surface 100a and are arranged in a strip-shaped structure in a top view of the first surface 100a. Further, a plurality of field electrode trenches 112 is formed in the semiconductor body 100. The gate trenches 108 and the field electrode trenches 112 extend in a direction z from the first surface 100a of the semiconductor body 100 towards the second surface 100b of the semiconductor body 100.

The field electrode trenches 112 have a needle-shaped, spatially closed shape and are locally arranged between the gate trenches 108. In top view of the first surface 100a, the field electrode trenches 112 have a rectangular form, wherein the centers are formed in a regular arrangement at grid points of a regular grid. The field electrode 110 and/or the field electrode trench 112 may also have a circular shape, a shape of a polygon or a ring shape in a top view of the first surface 100a. The field electrode 110 and/or the field electrode trench 112 may also have an annular, star-like, hexagonal, rhombic or any other suitable polygonal shape in a cross-sectional view parallel to the first surface 100a of the semiconductor body 100.

The field electrode trench 112 has a dimension a in the first direction x parallel to the main surface 100a, and a dimension b in a second direction y parallel to the main surface 100a, wherein the second direction y is perpendicular to the first direction x. A maximum dimension of the field electrode trench 112 parallel to the first surface 100a in the embodiment shown in FIG. 2A may be a diagonal dimension between two opposite corners of the rectangular shaped field electrode trench 112 in a top view of the first surface 100a, the diagonal dimension being $\sqrt{2}*a$, in case a is equal to b. In case of a circular shaped field electrode trench 112, the maximum dimension of the field electrode trench 112 parallel to the first surface 100a may be the diameter of the circular shaped field electrode trench 112 parallel to the first surface 100a.

According to an embodiment, the maximum dimension of the field electrode trench 112 parallel to the first surface 100a may be smaller than a depth c of the field electrode trench 112. The depth c of the field electrode trench 112 is the dimension of the field electrode trench 112 in a vertical direction, i.e. in a third direction z perpendicular to the first direction x and the second direction y and perpendicular to the first surface 100a. The field electrode trench 112 may have a ratio of a maximum dimension in parallel to the first surface 100a to a depth c that lies in a range of 0.05 to 1. In addition, the depth of the gate trenches 108 may be smaller than the depth of the field electrode trenches 112. The field electrode trenches 112 may have a maximum dimension in parallel to the first surface 100a of 0.1 μm to 7 μm and may have a depth of 0.5 μm to 30 μm depending on the voltage class.

In the gate trenches 108, the gate electrode 106 is formed, which also extends in a strip-shaped way in parallel to the first surface 100a. The gate electrode 106 is insulated from the semiconductor body 100 by a gate dielectric 114. A body region 116 adjoins a surface of the gate dielectric 114, which extends in parallel to the first surface 100a between the strip-shaped gate trenches 108. In the direction towards the main surface 100a, the first source region 102 in the load transistor part 400 or the second source region 104 in the sensor transistor part 500 is formed adjacent to the body region 116, which also extends in parallel to the main surface 100a between the strip-shaped gate trenches 108. The body region 116 is of a first conductivity type, for example p-type, while the first and second source regions 102, 104 are of a second conductivity type opposite to the first conductivity type, for example n-type.

The body region 116 adjoins a drift region 118 guiding a gate-controlled current between the first and second source regions 102, 104 and a common drain zone 120 at the second surface 100b of the semiconductor body 100. The semiconductor device 10 shown in FIG. 2A to 2C is a vertical semiconductor device comprising the common drain region 120 at the second surface 100b opposing the first surface 100a. The gate trenches 108 extend from the first surface 100a through the body regions 116 into the drift zone 118. The drift zone 118 and the drain zone 120 are of the same conductivity type as the first and second source regions 102, 104, for example of the first conductivity type. On the second surface 100b, a drain electrode 122 may be provided to electrically contact the common drain region 120.

In the field electrode trench 112, the field electrode 110 is formed. The field electrode 110 is insulated from the adjacent drift zone 118 by means of the field dielectric 124. The field dielectric 124 may be disposed to entirely insulate the field electrode 110 from the adjacent semiconductor body 100 as is, for example, shown in FIGS. 2B and 2C. According to a further embodiment, the field dielectric 124 may only be disposed in a lower portion of the field electrode trench 112, and the upper portion of the field electrode 110 is in contact with the adjacent first or second source regions 102, 104 of the semiconductor device 10. According to an embodiment, any field electrode such as the field electrode 110 is absent in the gate trenches 108 and any gate electrode such as the gate electrode 106 is absent in the field electrode trenches 112. In other words, according to this embodiment, there is no additional gate structure provided in an upper part of the field electrode trenches 112, and further there is no field electrode structure, e.g. a polycrystalline silicon structure provided below the gate electrode 106 within the gate trenches 108 and connected to source. The width of the gate trenches 108 measured perpendicularly to the first direction x may be smaller than a width of the field electrode trenches 112 measured perpendicularly to the first direction x. The plurality of field electrode trenches 112 including the field electrode trench may be arranged along the first direction x between two adjacent gate trenches 108. The plurality of field electrode trenches 112 each may have the same structure as the field electrode trench 112 as described above with regard to FIGS. 2A and 2B.

Due to the specific shape of the field electrode trenches 112, a greater portion of the drift zone 118 of the semiconductor device 10 per field electrode trench area may be charge compensated compared with stripe-shaped plate trenches. This allows for an increase of drift zone dimensions, and thus for a reduction of the on-state resistance. In more detail, as is illustrated in FIG. 2A, each of the field electrodes 110 may cause charge-compensation with respect to the semiconductor material disposed adjacent with respect to the first direction x and the second direction y.

On the other hand, each of the field electrodes 110 may be directly in contact with an external terminal, e.g. a source terminal so that an external potential may be effectively applied to the field electrode 110.

Due to the design of the field electrode trenches 112, the field electrode 110 of each single field electrode may be electrically coupled directly to a source plate. This results in a very low resistive, i.e. low-ohmic connection between all field electrodes and the source plate. As a consequence, the device may be switched in a very homogeneous manner, since a locally occurring dynamic avalanche effect can be lowered or even avoided. Accordingly, a negative impact on the switching transient of the device may be reduced or avoided. As a result, lower switching losses and reduced losses related to dynamic avalanche effects may be achieved. Hence, a higher switching frequency can be realized. At the same time, the drain-source voltage overshoot can be controlled by the specific resistance of the field electrode material.

The semiconductor device 10 comprises a current sensor, which is implemented in the sensor transistor part 500. The sensor transistor part 500 has the same cell structure as the load transistor part 400. Thus, the sensor transistor part 500 is integrated into the load transistor part 400 without interruptions or disturbances of the transistor unit arrangement. Furthermore, the gate trenches 108 and the field electrode trenches 112 in the load transistor part 400 and the sensor transistor part 500 share same trench and mesa dimensions. The active area of the sensor transistor part 500 has a defined ratio to the active area of the load transistor part 400, which may be in a range between 1000 to 50000, for example. The transistor cells of the sensor transistor part 500 and the load transistor part 400 have the drain region 120 in common. In addition, the gate electrode 106 is provided for the transistor cells in the load transistor part 400 and the sensor transistor part 500 in common to apply the same gate potential in the respective parts 400, 500. The gate trenches 108 include the common gate trench 108, wherein a first part 108a of the common gate trench 108 is in the load transistor part 400 and the second part 108b of the common gate trench 108 is in the sensor transistor part 500. As is shown in FIG. 2A, the first part 108a and the second part 108b of the common gate trench 108 are arranged consecutively along the first direction x. The separation of the first part 108a and the second part 108b of the common gate trench 108 may, however, be also provided along the second direction y.

The first source region 102 of the load transistor part 400 and the second source region 104 of the sensor transistor part 500 are electrically separated from each other, to provide a separate current path of the load transistor part 400 and the sensor transistor part 500. The proportionally reduced source-drain current flow from the second source region 104 of the sensor transistor part 500 may then be measured using an external circuit.

As can be seen from FIGS. 2B and 2C, an isolation layer 200 is formed on the first surface 100a of the semiconductor body 100. A patterned wiring layer 300 is formed on the first surface 100a. As shown in FIGS. 2B and 2C, the patterned wiring layer 300 is formed on the isolation layer 200. However, the patterned wiring layer 300 may also be formed directly on the first surface 100a, wherein the gate electrode 106 in the gate trenches 108 may be isolated from the patterned wiring layer 300 by a dielectric covering the gate electrode 106.

The patterned wiring layer 300 acts as a source pad for separately contacting the first source region 102 of the load transistor part 400 and the second source region 104 of the sensor transistor part 500. Therefore, the patterned wiring layer 300 comprises a load transistor connection part 310 being electrically connected to the first source region 102 in the load transistor part 400, and a sensor transistor connection part 320 being electrically connected to the second source region 104 in the sensor transistor part 500. As can be seen from FIGS. 2B and 2C, the patterned wiring layer 300 comprises a stacked metal layer structure having a first metal layer 330 on the isolation layer 200 on the first surface 100a and a second metal layer 340 on the first metal layer 330. The load transistor connection part 310 of the patterned wiring layer 300 is connected to the first source region 102, the body region 116, and the field electrodes 110 by an electric contact structure 350. The electric contact structure extends through the isolation layer 200 between the first surface 100a and the patterned wiring layer 300. The electric contact structure 350 further extends into the semiconductor body 100 through the first source region 102 to contact both the first source region 102 and the body region 116 by a trench contact structure. The electric contact structure 350 may be of the same material as the first metal layer 330. The sensor transistor connection part 320 of the patterned wiring layer 300 is connected to the second source region 104, the body region 116, and the field electrodes 110 by the electric contact structure 350 through the isolation layer 200. The electric contact structure 350 further extends into the semiconductor body 100 through the second source region 104 to contact both the second source region 104 and the body region 116 by a trench contact structure.

As shown in FIG. 2A, the patterned wiring layer 300 further comprises a sensor transistor interconnection part 360 in the load transistor part 400. The sensor transistor interconnection part 360 is electrically connected to the sensor transistor connection part 320 and electrically separated from the load transistor connection part 310 and the first source region 102. The sensor transistor interconnection part 360 may be integrally formed with the sensor transistor connection part 320 and/or may be of the same material as the sensor transistor connection part 320 of the patterned wiring layer 300. The sensor transistor interconnection part 360 is provided to electrically connect the sensor transistor part 500 of the semiconductor device 10 with an external circuit to measure the current flowing through the sensor transistor part 500. The sensor transistor interconnection part 360 acts as a supply line for the sensor transistor part 500, wherein no vertical current is flowing in an area of the load transistor part 400 overlapping the sensor transistor interconnection part 360. In other words, the part of the load transistor part 400, which is arranged below the current supply line for the sensor transistor part 500 (i.e. sensor transistor interconnection part 360), has to be inactivated or isolated from the sensor transistor interconnection part 360 to prevent an additional vertical current from the sensor transistor interconnection part 360 into the semiconductor body 100 beside the vertical current in the sensor transistor part 500. Therefore, the first source region 102 may be absent in the area of the load transistor part 400 overlapping the sensor transistor interconnection part 360, as can be seen from FIGS. 2A and 2B. The sensor transistor interconnection part 360 is provided to ensure a measurement of the vertical current only in a central part of the load transistor part 400 without a current measurement in a part adjoining an edge termination part 600 of the semiconductor device 10. As can be seen from FIG. 2A, an edge termination structure comprising a plurality of field electrodes 110 arranged in a grid, which may be surrounded by a closed field plate trench ring, is provided. Also other edge termination structures may be implemented, for example depending on voltage blocking requirements. Examples for other edge termination structures include planar edge termination structures and mesa edge termination structures such as floating ring structures, junction termination extension (JTE) structures, variation of lateral doping (VLD) structures, multiple junction termination extension (MJTE) structures and bevel edge terminations such as a positive bevel edge termination structure or a negative bevel edge termination structure, for example.

In another embodiment, the sensor transistor connection part 320 may also be provided in a part adjoining the edge termination part 600 of the semiconductor device 10, wherein the second source region 104 provides a vertical current through the semiconductor device 10 in an area of the sensor transistor connection part 310 overlapping the sensor transistor part 500.

The first metal layer 330 may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, and/or Pd. The second metal layer 340 may consist of or contain, as main constituent(s), aluminium Al, copper Cu or alloys of aluminium or copper, for example AlSi, AlCu, or AlSiCu.

The first isolation layer 200 may include any dielectric or a combination of dielectrics adapted to isolate the semiconductor body 100 from the patterned wiring structure 300. The isolation layer 200 may include one or any combination of an oxide, a nitride, oxynitride, a low-k material, an imide, an insulating resin or glass such as a tetraethylorthosilicate (TEOS/undoped silicate glass (USG)) or a phosphosilicate glass (PSG) or a borophosphosilicate glass (BPSG), for example.

A thickness of the first metal layer 330 may be in a range of 50 nm to 500 nm, whereas a thickness of the second metal layer 340 may be in a range of 1 μm to 10 μm. The second metal layer 340 is provided as a power metallization layer, wherein the first metal layer 330 may be adapted to be patterned with high precision. In particular, the first metal layer 330 may be patterned with a resolution of between 100 nm to 500 nm, or between 150 nm and 250 nm. The pitch of a transistor cell of the semiconductor device 10 may be in a range of 1 μm to 10 μm. As can be seen from FIG. 2A, the second metal layer 340 is absent in a boundary region between the load transistor part 400 and the sensor transistor part 500. Herein, only the first metal layer 330 is present in the boundary part and not covered by the second metal layer 340. The second metal layer 340 may cover the first metal layer 330 in the sensor transistor part 500 and within the sensor transistor interconnection part 360, to enhance the conductivity of the supply line (i.e. the sensor transistor interconnection part 360) and the sensor part (i.e. the sensor transistor part 500), wherein in a region adjacent to the boundary line between the load transistor part 400 and the sensor transistor part, the thin first metal layer 330 is not covered by the thick second power metal layer 340. In an embodiment, the second metal layer 340 may be absent in the sensor transistor part 500. Thus, by providing the stacked metal layer structure of the first metal layer 330 and the second metal layer 340 being absent in the boundary region, i.e. a region being adjacent to the boundary line between the load transistor part 400 and the sensor transistor part 500, or being absent in the sensor transistor part 500, a power metallization may be provided in the load transistor part 400, which provides a sufficient current flow through the second metal layer 340, wherein at the same time a patterning with high precision is achieved in areas, in which the second metal layer 340 is absent. As a consequence, by providing the stacked metal layer structure 330, 340, the design rules for pattering a wiring structure may be circumvented.

As can be seen from FIG. 2A to 2C, the first source region 102 of the load transistor part 400 and the second source region 104 of the sensor transistor part 500 are electrically separated from each other. As shown in FIG. 2A, a disconnection part 126 is provided between at least two adjacent gate trenches 108 to electrically separate the first and second source regions 102, 104, wherein dopants of the first and second source regions 102, 104 are absent in the disconnection part 126.

Figure 3A:
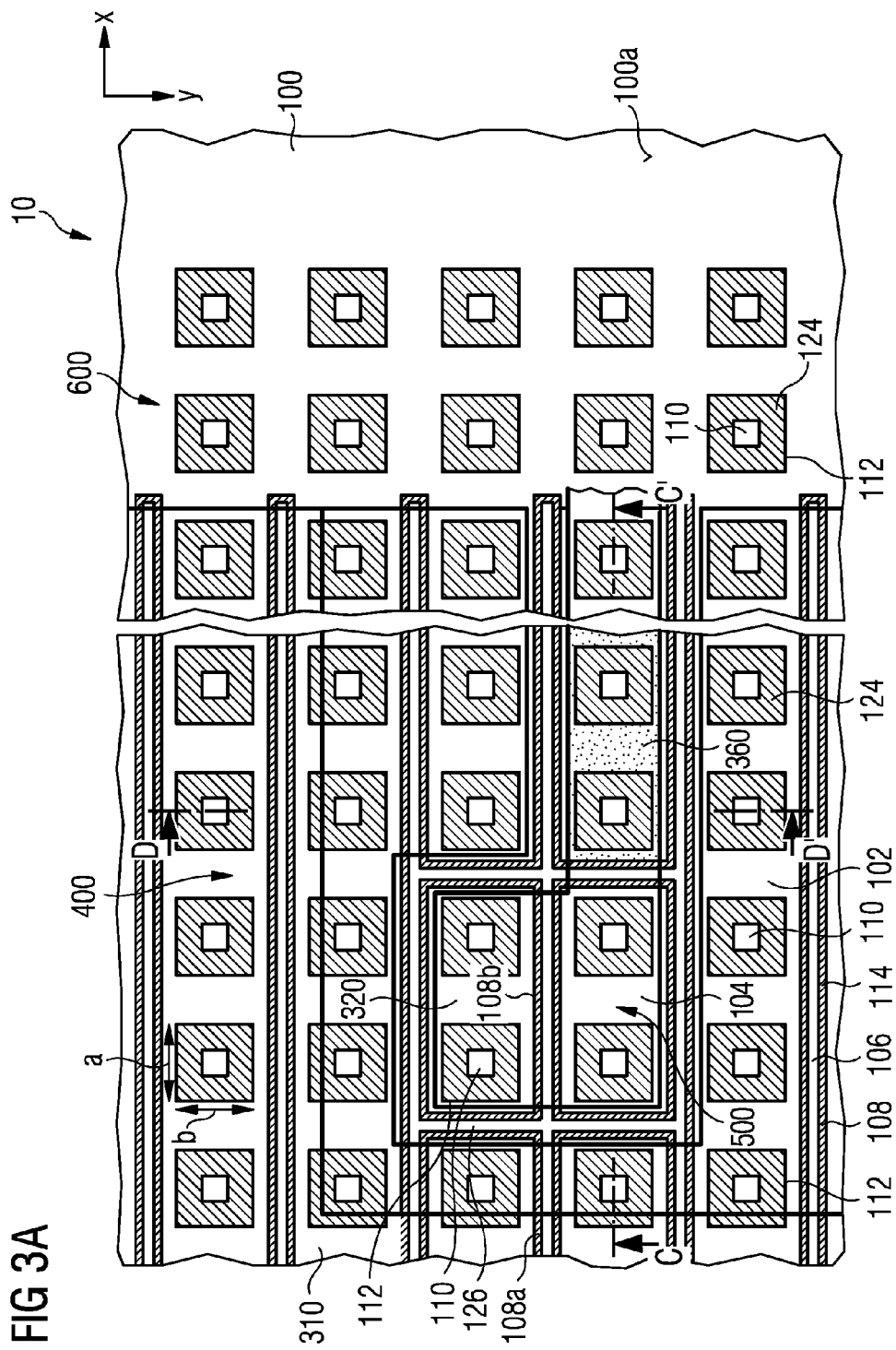
FIG. 3A is a schematic plan view of a portion of a semiconductor device according to another embodiment.

FIG. 3A is a schematic plan view of a portion of a semiconductor device 10 according to another embodiment. Herein, FIGS. 3B and 3C are schematic cross-sectional views of a portion of a semiconductor device 10 taken along the section plane C-C' or D-D' of FIG. 3A, respectively.

Figure 3B:
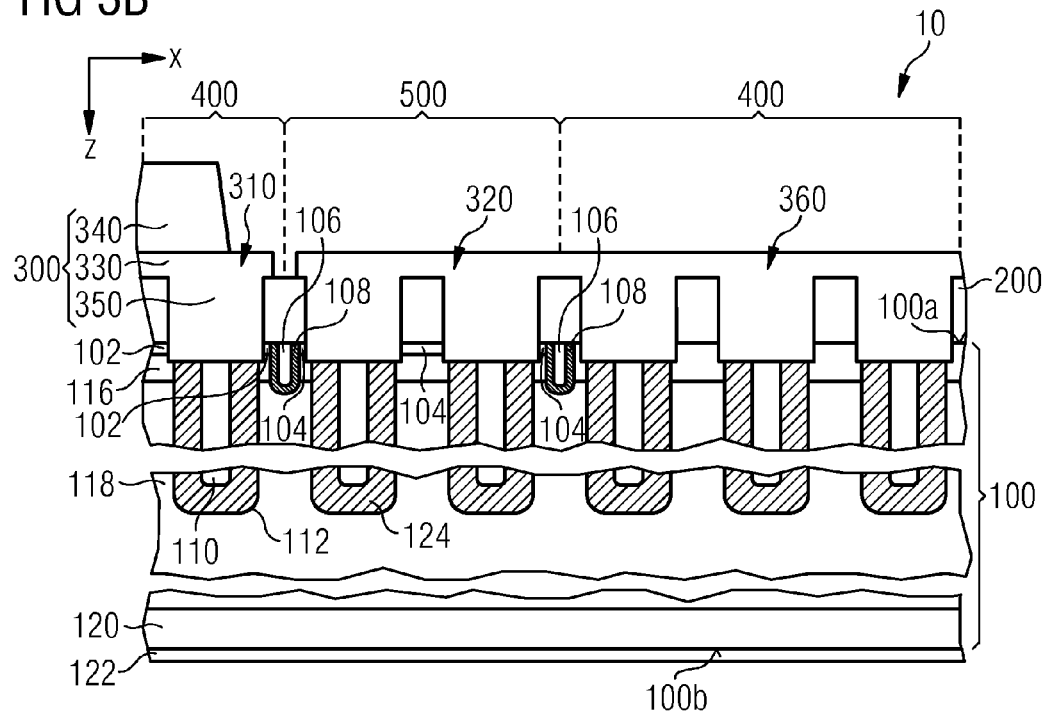
FIG. 3B is a schematic cross-sectional view of a portion of a semiconductor device taken along the section plane C-C' of FIG. 3A.
Figure 3C:
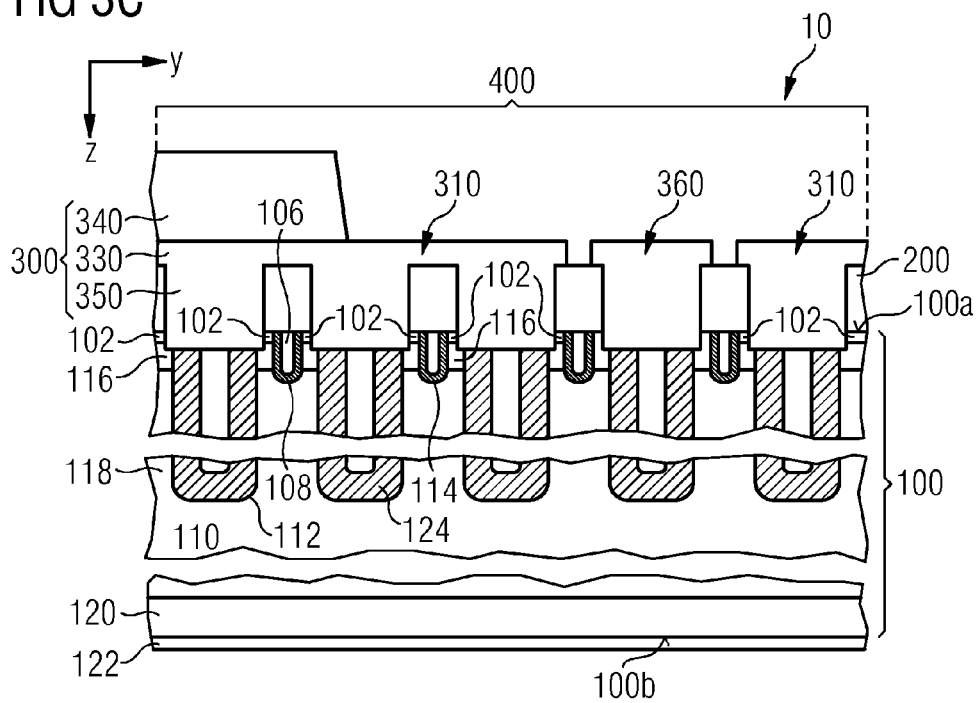
FIG. 3C is a schematic cross-sectional view of a portion of a semiconductor device taken along the section plane D-D' of FIG. 3A.

In the FIGS. 2A to 2C and 3A to 3C, similar regions and structures are indicated with the same reference numbers, so that reference is made to the previous description of FIG. 2A to 2C with regard to corresponding further information concerning the structure and function of the regions or the structures in FIGS. 3A to 3C.

As can be seen from FIGS. 3A and 3C, the disconnection part 126 is a gate trench extending between at least two adjacent gate trenches 108 to electrically separate the first and second source regions 102, 104. Thus, according to the embodiment of FIG. 3A to 3C, the first and second source regions 102, 104 are electrically separated from each other by means of a separating trench structure crossing the gate trenches 108 arranged in parallel to the first surface 100a in the first direction x. In an embodiment, the trenches for separating the first and second source regions 102, 104 are extended in the second direction y being perpendicular to the first direction x.

Figure 4B:
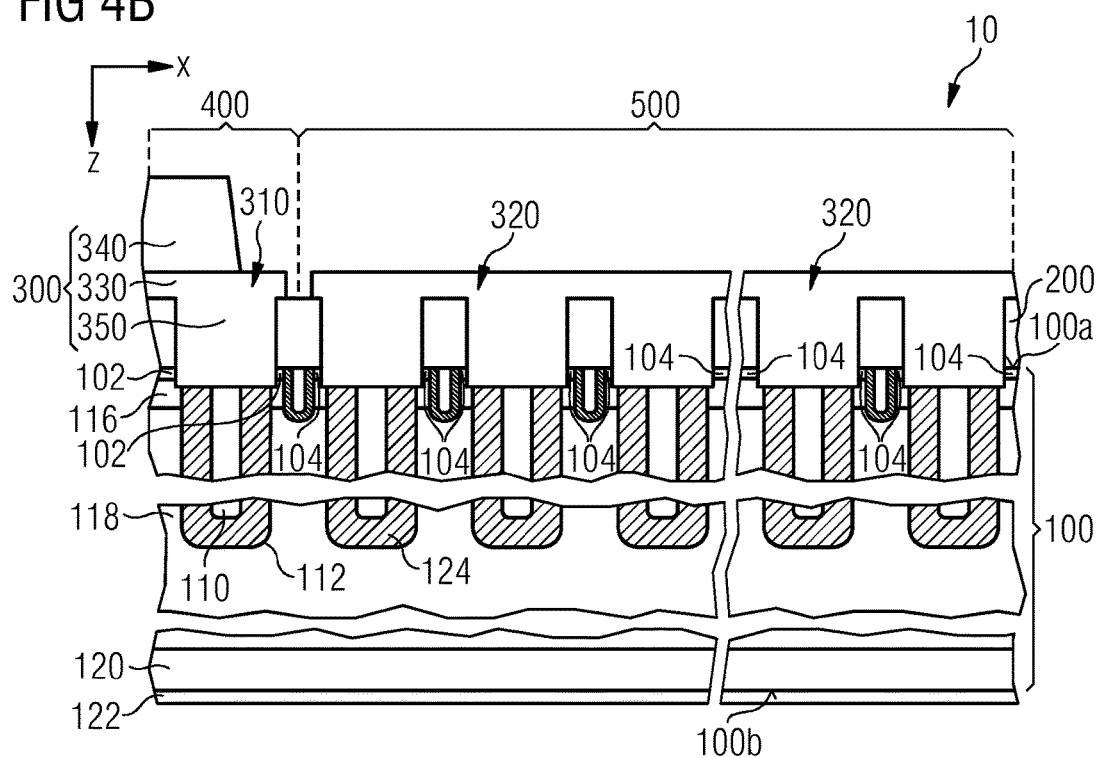
FIG. 4B is a schematic cross-sectional view of a portion of a semiconductor device taken along the section plane E-E' of FIG. 4A according to an embodiment.

FIG. 4A is a schematic plan view of a portion of a semiconductor device 10 according to another embodiment. Herein, FIGS. 4B and 4C are directed to an embodiment of the semiconductor device of FIG. 4A, and FIGS. 4C and 4E are directed to another embodiment of the semiconductor device 10 of FIG. 4A.

As can be seen from FIG. 4A, the gate trenches 108 including and having each the same structure as the common gate trench 108 as described above with regard to FIGS. 2A and 2B are arranged in a grid-shaped structure in a top view of the first surface 100a. In this embodiment, the plurality of field electrode trenches 112 including and having each the same structure as the field electrode trench 112 as described above with regard to FIGS. 2A and 2B are arranged at central grid points of the grid-shaped structure of the gate trenches 108. The grid-shaped trench gate structure provides a plurality of source regions electrically separated from each other and arranged in a grid, which are each defined by the surrounding gate trenches 108. Thus, an additional disconnection part 126 for separating the first and second source regions 102, 104 is not necessary according to the embodiment of FIG. 4A.

Figure 4C:
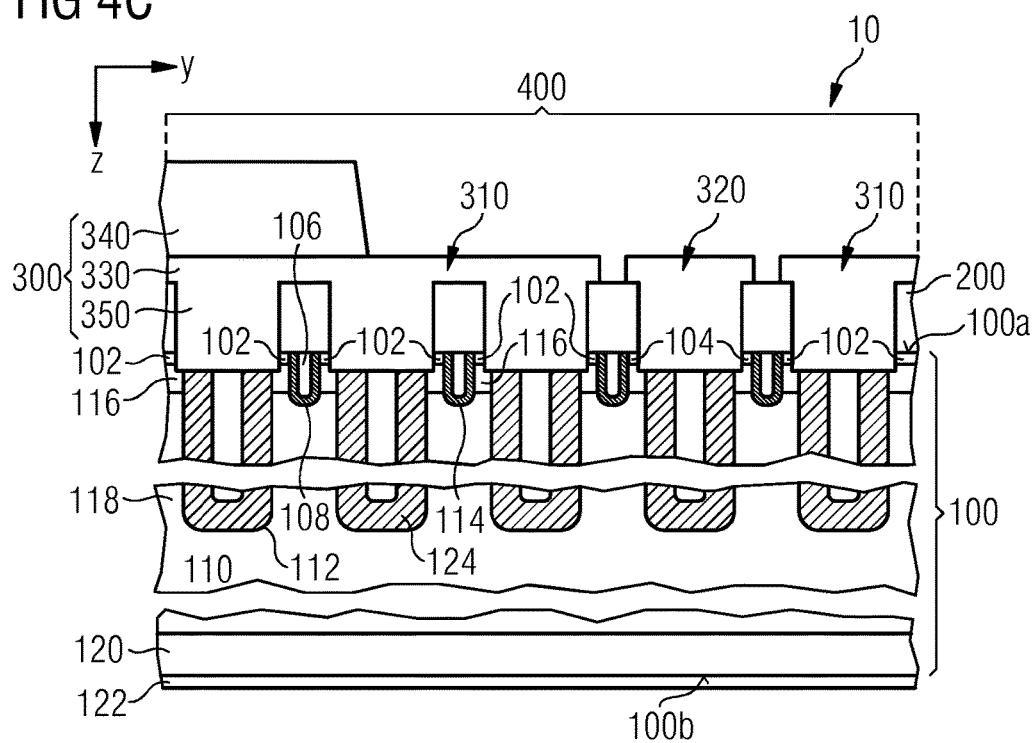
FIG. 4C is a schematic cross-sectional view of a portion of a semiconductor device taken along the section plane F-F' of FIG. 4A according to an embodiment.

According to the embodiment of the semiconductor device of FIG. 4A, as shown in FIGS. 4B and 4C, the sensor transistor part 500 is extended to the edge termination part 600 of the semiconductor device 10. A sensor transistor interconnection part 360, which overlaps an inactivated part of the load transistor part 400 is not provided in the embodiment of FIGS. 4B and 4C.

Figure 4D:
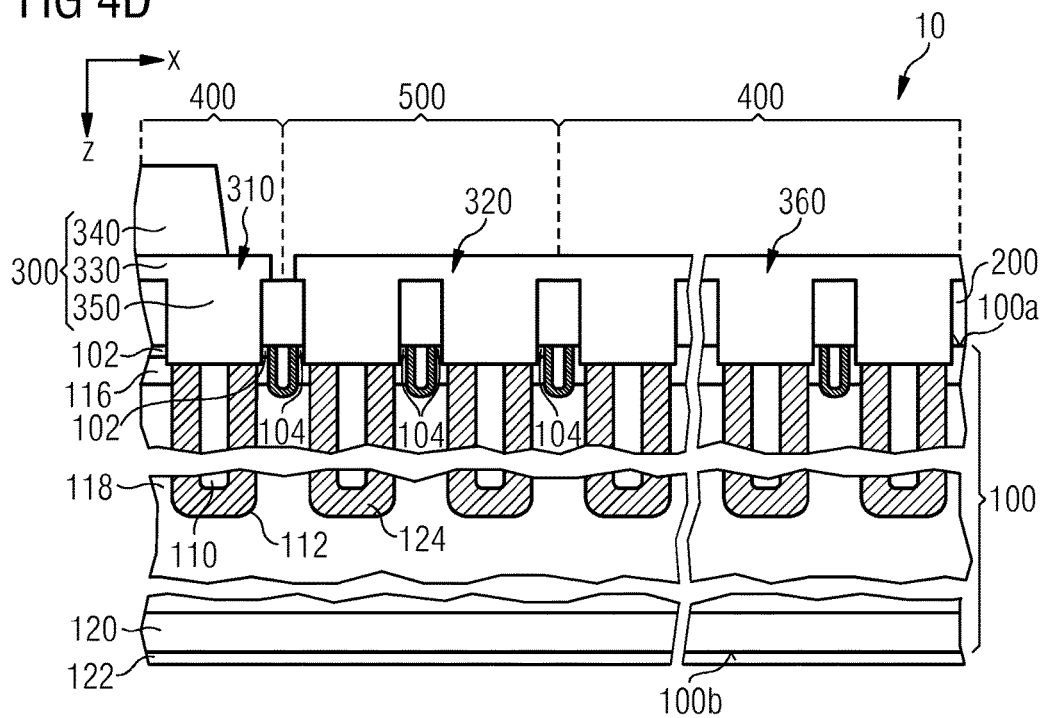
FIG. 4D is a schematic cross-sectional view of a portion of a semiconductor device taken along the section plane E-E' of FIG. 4A according to another embodiment.
Figure 4E:
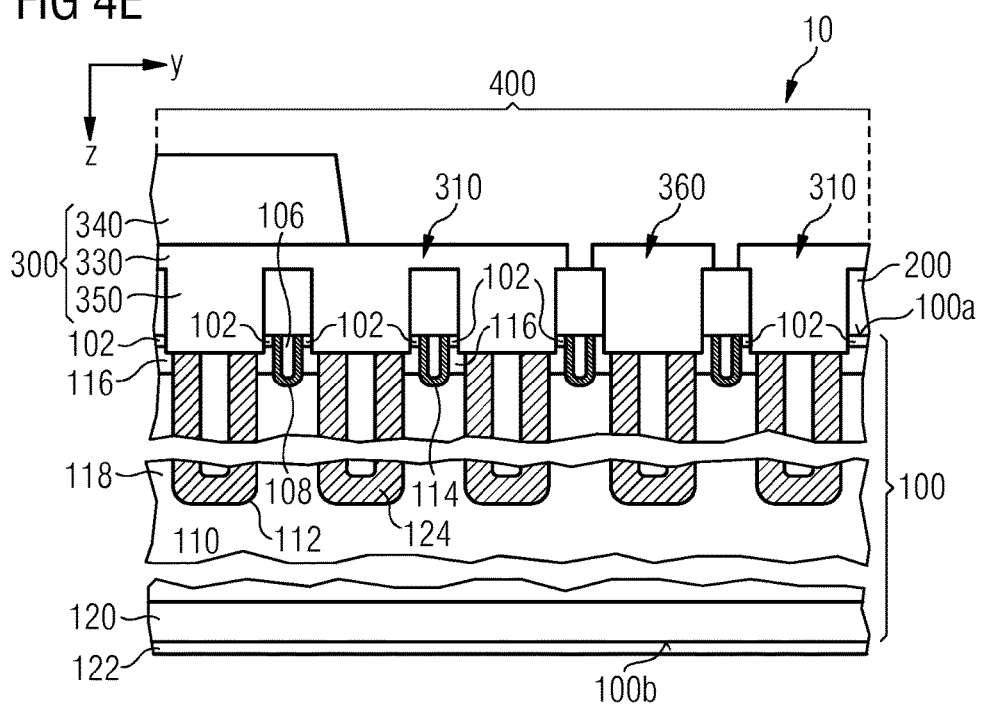
FIG. 4E is a schematic cross-sectional view of a portion of a semiconductor device taken along the section plane F-F' of FIG. 4A according to another embodiment.

According to the another embodiment of FIGS. 4D and 4E of the semiconductor device 10, the sensor transistor interconnection part 360 is provided, wherein the first source region 102 is absent in an area of the load transistor part 400 overlapping the sensor transistor interconnection part 360.

Integration of the current sensor structure into a needle trench geometry has the effect that no sensor border is needed, resulting in a reduced area loss. A needle trench geometry may be defined as a structure, in which a field electrode 110 in a field electrode trench 112 is provided, which extends into the semiconductor body 100 from the first surface 100a, wherein a maximum dimension of the field electrode trench 112 parallel to the first surface 100a is smaller than a depth of the field electrode trench 112. The resulting structure of this geometry may be a plurality of needle-shaped field electrodes 110 within respective needle-shaped field electrode trenches 112 extending into the semiconductor body 100. In addition, a process flow of manufacturing the semiconductor device 10 has not to be changed for integrating the current sensor structure of the sensor transistor part 500 into the semiconductor device 10. Furthermore, low layout effort is achieved, since a source lithography change is superfluous due to the isolation of individual cells in a gate trench grid. Further, contribution of current flow of the input lead to cell field center can be minimized by locally eliminating source implant.

In addition, the first metal layer 330 in the sensor transistor interconnection part 360 or in the sensor transistor connection part 320 may be covered with the second metal layer 340 to reduce the line resistance of the sensor transistor interconnection part 360.

According to the embodiments of the semiconductor device 10, the sensor cell field is perfectly embedded into the power MOSFET cell field of the semiconductor device 10. This results in no deviations to the cell field pitch. Further, reduced deviation of current flow proportionality between the sense and power MOSFET can be achieved. Furthermore, a reduced difference between measured and geometrical ratio of the current flowing through the load transistor and the current flowing through the sensor transistor is achieved. Variations of processes affect the sensor transistor part 500 and the load transistor part 400 identically, thus relative variations between the load transistor part 400 and sensor transistor part 500 are compensated. As a result, significant narrowing of distribution of the ratio of the current flowing through the load transistor and the current flowing through the sensor transistor is achieved.

By the use of electrically separated needle cells for connection to different source pads, edge effects are suppressed, resulting in homogeneous current distributions. According to an embodiment, a needle trench geometry is implemented with line space gate trenches 108. One option is to split source of sense and cell field by interruption in the source mask. A second option is to use a gate trench rectangle to isolate body and source of sense and cell field.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising a load transistor part and a sensor transistor part;
a first source region of the load transistor part and a second source region of the sensor transistor part, the first and second source regions being electrically separated from each other;
a common gate electrode in a common gate trench extending into the semiconductor body from a first surface, the gate trench extending through the load transistor part and the sensor transistor part, wherein a whole cross-section of the common gate trench extends through both the load transistor part and the sensor transistor part; and
a field electrode in a field electrode trench extending into the semiconductor body from the first surface, wherein a maximum dimension of the field electrode trench parallel to the first surface is smaller than a depth of the field electrode trench.

2. The semiconductor device of claim 1, wherein the semiconductor device is a vertical semiconductor device comprising a common drain region at a second surface opposing the first surface.

3. The semiconductor device of claim 1, wherein the depth of the common gate trench is smaller than the depth of the field electrode trench.

4. The semiconductor device of claim 1, wherein the field electrode trench has a ratio of a maximum dimension in parallel to the first surface to a depth that lies in a range of 0.05 to 1.

5. The semiconductor device of claim 1, wherein the field electrode trench has a circular shape, a shape of a polygon or a ring shape in a top view of the first surface.

6. The semiconductor device of claim 1, further comprising a plurality of gate trenches including the common gate trench, the gate trenches extending in a first direction parallel to the first surface and arranged in a strip-shaped structure in a top view of the first surface.

7. The semiconductor device of claim 6, further comprising a plurality of field electrode trenches including the field electrode trench arranged along the first direction between two adjacent gate trenches.

8. The semiconductor device of claim 6, further comprising a disconnection part between at least two adjacent gate trenches to electrically separate the first and second source regions, wherein dopants of the first and second source regions are absent in the disconnection part.

9. The semiconductor device of claim 6, further comprising a gate trench extended between at least two adjacent gate trenches to electrically separate the first and second source regions.

10. The semiconductor device of claim 1, further comprising a plurality of gate trenches including the common gate trench, the gate trenches being arranged in a grid-shaped structure in a top view of the first surface.

11. The semiconductor device of claim 10, further comprising a plurality of field electrode trenches including the field electrode trench, the field electrode trenches being arranged at central grid points of the grid-shaped structure of the gate trenches.

12. The semiconductor device of claim 1, further comprising a patterned wiring layer on the first surface of the semiconductor body, the patterned wiring layer comprising a load transistor connection part electrically connected to the first source region, and a sensor transistor connection part electrically connected to the second source region.

13. The semiconductor device of claim 12, wherein the patterned wiring layer is further electrically connected to the field electrode.

14. The semiconductor device of claim 12, wherein the patterned wiring layer comprises a stacked metal layer structure having a first metal layer on the first surface and a second metal layer on the first metal layer, wherein the second metal layer is absent in a boundary region between the load transistor part and the sensor transistor part.

15. The semiconductor device of claim 14, wherein the first metal layer comprises at least one of a group consisting of Ni, Ti, Ag, Au, W, Pt, and Pd, and wherein the second metal layer comprises at least one of a group consisting of Al, Cu, AlSi, AlCu, and AlSiCu.

16. The semiconductor device of claim 14, wherein a thickness of the first metal layer is in a range of 50 nm to 500 nm, and a thickness of the second metal layer is in a range of 1 μm to 10 μm.

17. The semiconductor device of claim 12, wherein the patterned wiring layer further comprises a sensor transistor interconnection part in the load transistor part, the sensor transistor interconnection part being electrically connected to the sensor transistor connection part and electrically separated from the load transistor connection part and the first source region.

18. The semiconductor device of claim 17, wherein the first source region is absent in an area of the load transistor part overlapping the sensor transistor interconnection part.

19. The semiconductor device of claim 1, wherein the gate trenches are devoid of field electrodes, and the field electrode trenches are devoid of gate electrodes.

20. The semiconductor device of claim 1, wherein a width of the common gate trench measured perpendicularly to a first direction is smaller than a width of the field electrode trench measured perpendicularly to the first direction.

* * * * *